(12) United States Patent
Kim

(10) Patent No.: US 7,834,340 B2
(45) Date of Patent: Nov. 16, 2010

(54) PHASE CHANGE MEMORY DEVICES AND METHODS OF FABRICATING THE SAME

(75) Inventor: Nam-Bin Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 12/167,504

(22) Filed: Jul. 3, 2008

(65) Prior Publication Data

US 2009/0008622 A1 Jan. 8, 2009

(30) Foreign Application Priority Data

Jul. 6, 2007 (KR) ...................... 10-2007-0068150

(51) Int. Cl.
*H01L 29/04* (2006.01)
(52) U.S. Cl. .................. 257/3; 257/4; 257/5; 257/289; 257/E29.276; 365/100; 365/148
(58) Field of Classification Search .................. None
See application file for complete search history.

(56) References Cited

U.S. PATENT DOCUMENTS 6,261,932 B1 7/2001 Hulfachor 6,995,446 B2 2/2006 Karpov et al.
2008/0113469 A1 * 5/2008 Eun et al. .................. 438/102

FOREIGN PATENT DOCUMENTS

KR 1020060094424 A 8/2006
KR 1020060110559 A 10/2006

* cited by examiner

*Primary Examiner*—Evan Pert
*Assistant Examiner*—Scott R Wilson
(74) *Attorney, Agent, or Firm*—Myers Bigel Sibley & Sajovec

(57) ABSTRACT

Phase change memory devices are provided including a selection element electrically connected to a phase change material pattern. The selection element includes a metallic conductor and a semiconductor that are in contact with each other. A depletion region in contact with a metallic pattern is generated in the semiconductor in an equilibrium state. The depletion region includes a high barrier region having an electric potential barrier higher than an interface electric potential barrier and a low barrier region having an electric potential barrier lower than the interface electric potential barrier. Related methods are also provided.

20 Claims, 18 Drawing Sheets

PHASE CHANGE MEMORY DEVICES AND METHODS OF FABRICATING THE SAME

CLAIM OF PRIORITY

This application claims the benefit of Korean Patent Application No. 10-2007-0068150, filed on Jul. 6, 2007, in the Korean Intellectual Property Office, the disclosure of which is incorporated herein in its entirety by reference.

FIELD OF THE INVENTION

The present invention relates generally to semiconductor devices and methods of fabricating the same and, more particularly to, phase change memory devices and methods of fabricating the same.

BACKGROUND OF THE INVENTION

A phase change memory device has the non-volatile characteristic of retaining its stored data even when power is removed form the memory device. A unit cell of a phase change memory device may include a phase change material used as an element of data storage. The phase change material may change into a crystallization state or an amorphous state according to a heat temperature and/or a heat supply time. Typically, a resistivity of a phase change material of a crystallization state is lower than that of an amorphous state. Using a resistivity change according to a state of a phase change material, a phase change memory cell may store logic data and discriminate it.

The phase change memory cell may include a selection element that is electrically connected to the phase change material used as the element of data storage. The selection element is required to select one among a plurality of the phase change memory cells. A MOS transistor is well known as the selection element. Typically, a MOS transistor includes source and drain regions spaced apart from each other, and a gate on a channel between the source and drain regions.

As the integration of semiconductor devices increases, phase change memory devices are also becoming highly integrated. Since a metal oxide semiconductor (MOS) transistor has a comparatively large area, it may be difficult to highly integrate a phase change memory cell including a MOS transistor.

SUMMARY OF THE INVENTION

Some embodiments of the present invention provide a phase change memory device. In some embodiments of the present invention, the phase change memory device may include a selection element including a metallic conductor and a semiconductor that are in contact with each other, and a phase change material pattern electrically connected to the selection element. A depletion region in contact with the metallic conductor is generated in the semiconductor in an equilibrium state. The depletion region may include a low barrier region and a high barrier region. The low barrier region has an electric potential barrier lower than an interface electric potential barrier generated in a contact surface of the metallic conductor and the semiconductor. The high barrier region is disposed between the low barrier region and the metallic conductor and has an electric potential barrier higher than the interface electric potential barrier.

In further embodiments of the present invention, a spot having a maximum electric potential barrier is disposed in the high barrier region and is spaced apart from the contact surface and the low barrier region.

In still further embodiments of the present invention, as a position in the selection element moves from the spot having the maximum electric potential barrier toward the contact surface, the electric potential barrier in the high barrier region reduces. Furthermore, as a position in the selection element moves from the spot having the maximum electric potential barrier toward the low barrier region, the electric potential barrier in the high barrier region reduces.

In some embodiments of the present invention, the semiconductor may include a bulk portion doped with a first conductive dopant, and a surface portion disposed between the metallic conductor and the bulk portion and doped with a second conductive dopant, wherein the depletion region is generated in the surface portion and a portion of the bulk portion adjacent to the surface portion.

In further embodiments of the present invention a spot having a maximum electric potential barrier in the high barrier region may be disposed in the surface portion.

In still further embodiments of the present invention, the surface portion may have a dopant concentration that reverses an internal electric field at the contact surface, the internal electric field being generated by the depletion region formed in the bulk portion.

In some embodiments of the present invention, the first conductive dopant may be an n-type dopant and the second conductive dopant may be a p-type dopant, wherein an own work function of the metallic conductor is greater than an own work function of the bulk portion.

In further embodiments of the present invention, the first conductive dopant may be a p-type dopant and the second conductive dopant may be an n-type dopant, wherein an own work function of the metallic conductor is smaller than an own work function of the bulk portion.

In still further embodiments of the present invention, a heat plug may be disposed between the metallic conductor and the phase change material pattern, wherein the phase change material pattern is electrically connected to the metallic conductor via the heat plug.

Some embodiments of the present invention provide a phase change memory device may including a selection element including a semiconductor pattern and a metallic pattern that are in contact with each other on a substrate, and a phase change material pattern electrically connected to the selection element on the substrate. The semiconductor pattern includes a bulk portion doped with a first conductive dopant, and a surface portion disposed between the metallic pattern and the bulk portion and doped with a second conductive dopant. A depletion region is generated in the surface portion and a portion of the bulk portion adjacent to the surface portion in an equilibrium state.

In further embodiments of the present invention, the surface portion may have a dopant concentration that reverses an internal electric field at the contact surface, the internal electric field generated by the depletion region formed in the bulk portion.

In still further embodiments of the present invention, an insulating layer may be disposed on the substrate, wherein the metallic pattern is disposed in an opening penetrating the insulating layer, and wherein the phase change material pattern is disposed on the insulating layer and electrically connected to the metallic pattern.

In some embodiments of the present invention, the semiconductor pattern may include a buffer semiconductor pattern disposed in the opening under the metallic pattern, wherein the surface portion is formed at an upper surface of the buffer semiconductor pattern, the metallic pattern is in contact with the upper surface of the buffer semiconductor pattern and the bulk portion includes a portion of the buffer semiconductor pattern disposed under the surface portion.

In further embodiments of the present invention, a doped region may be provided that is formed in the substrate and doped with the first conductive dopant, wherein the buffer semiconductor pattern is in contact with the doped region.

In still further embodiments of the present invention, the semiconductor pattern may include the doped region formed in the substrate, wherein the metallic pattern is in contact with the doped region, the surface portion is formed at a surface of the doped region that is in contact with the metallic pattern, and the bulk portion includes a portion of the doped region under the surface portion.

In some embodiments of the present invention, a heat plug may be disposed between the metallic pattern and the phase change material pattern, wherein the heat plug is in contact with the metallic pattern and the phase change material pattern.

In further embodiments of the present invention, the heat plug may be disposed in the opening on the metallic pattern.

In still further embodiments of the present invention, a mold layer may be disposed between the insulating layer and the phase change material pattern, wherein the mold layer is formed of an insulating material, and the heat plug is disposed in a hole that penetrates the mold layer and exposes the metallic pattern.

In some embodiments of the present invention, the first conductive dopant may be an n-type dopant and the second conductive dopant may be a p-type dopant, wherein an own work function of the metallic pattern is greater than an own work function of the bulk portion.

In further embodiments of the present invention, the first conductive dopant may be a p-type dopant and the second conductive dopant may be an n-type dopant, wherein an own work function of the metallic pattern is smaller than an own work function of the bulk portion.

DETAILED DESCRIPTION OF EMBODIMENTS OF THE INVENTION

Figure 1:
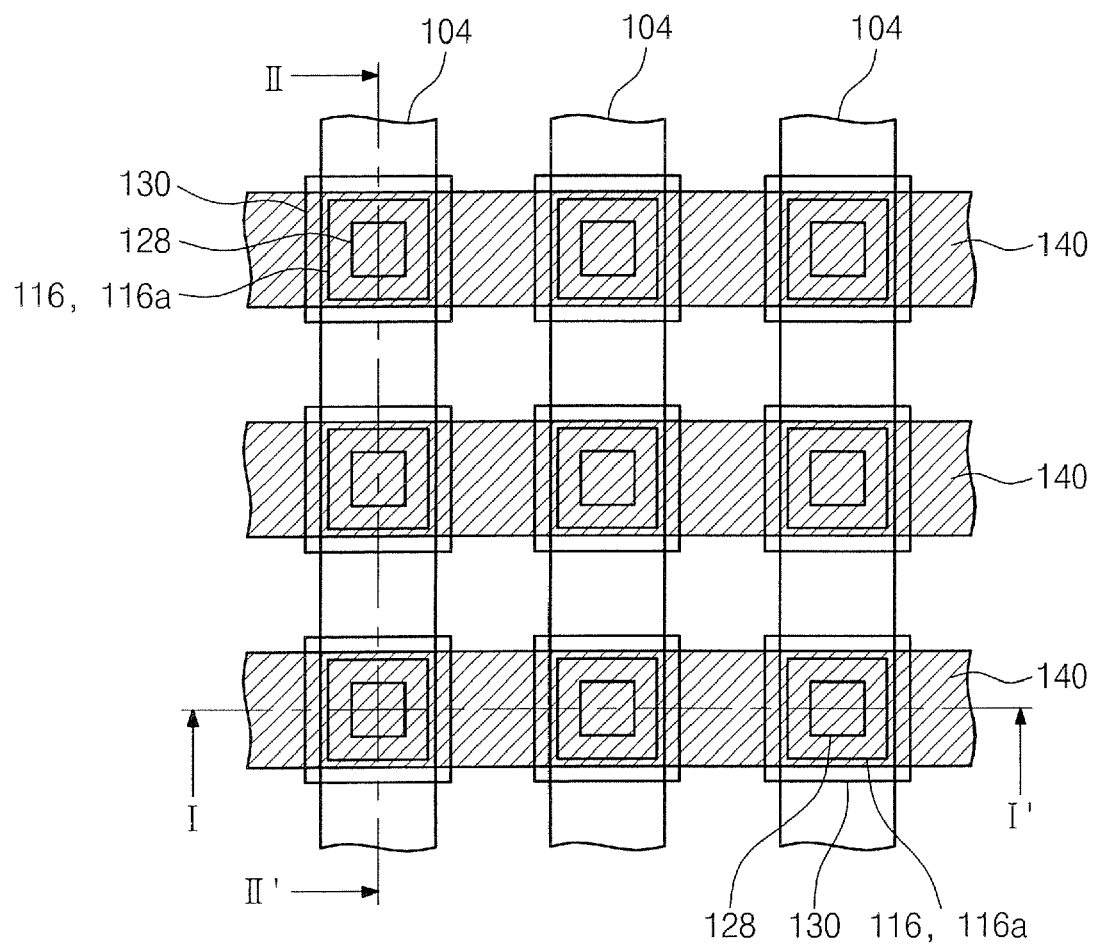
FIG. 1 is a top plan view of a phase change memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2A:
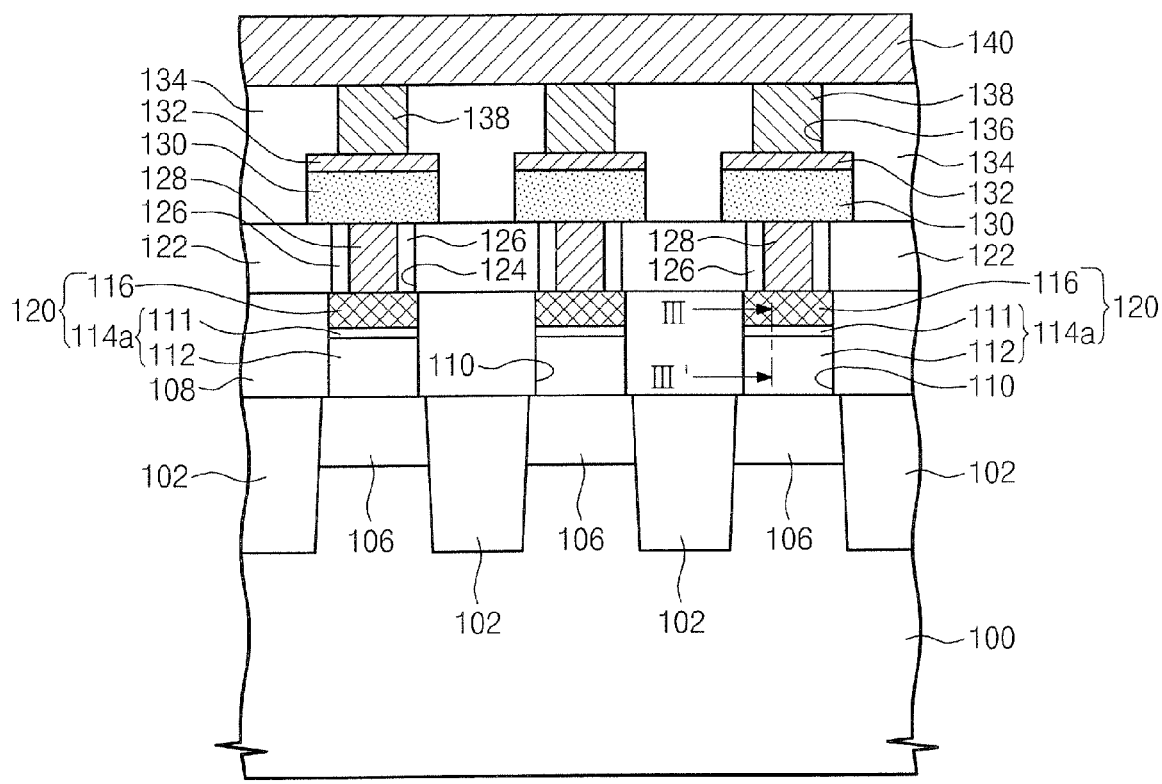
FIG. 2A is a cross section taken along the line I-I' of FIG. 1 illustrating a phase change memory device according to some embodiments of the present invention.
Figure 2B:
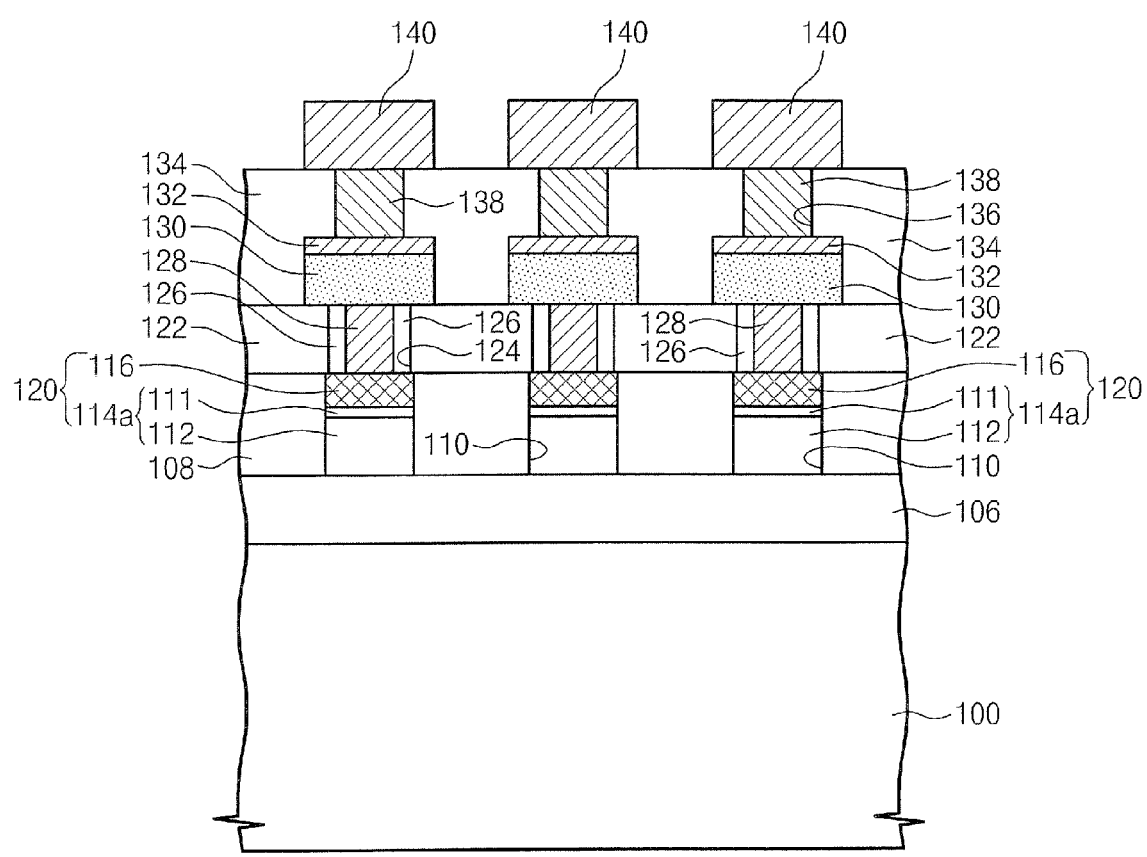
FIG. 2B is a cross section taken along the line II-II' of FIG. 1 illustrating a phase change memory device according to some embodiments of the present invention.

Some embodiments of the present invention will be discussed herein with respect to FIGS. 1 through 17. FIG. 1 is a top plan view of a phase change memory device according to some embodiments of the present invention, FIG. 2A is a cross section taken along the line I-I' of FIG. 1 illustrating a phase change memory device according to some embodiments of the present invention and FIG. 2B is a cross section taken along the line II-II' of FIG. 1 illustrating a phase change memory device according to some embodiments of the present invention. Referring first to FIGS. 1, 2A and 2B, a device isolation layer 102 may be disposed on a semiconductor device 100, referred to herein as a semiconductor substrate, to define active regions 104. The device isolation layer 102 may have, for example, a trench shape. The active region 104 may be a portion of the substrate 100 surrounded by the device isolation layer 102. The active regions 104 may extend along a first direction. In other words, the active regions 104 may be lines that are parallel to one another.

A doped region 106 is disposed in the active region 104. The doped region 106 is doped with a first conductive dopant. The active region 104 is doped with a second conductive dopant. A plurality of the doped regions 106 are formed in a corresponding plurality of the active regions 104. The doped regions 106 extend along the active regions 104 in the first direction. The doped regions 106 may be, for example, line shaped.

A lower insulating layer 108 is provided on the surface of the substrate 100. The lower insulating layer 108 may include, for example, oxide. A selection element 120 is disposed in an opening 110 that penetrates the lower insulating layer 108 and exposes the doped region 106. A plurality of selection elements 120 are arranged along rows and columns. The plurality of selection elements 120 are spaced apart from each other. The column is the first direction and the row is a second direction, which may be substantially perpendicular to the first direction. Selection elements 120 arranged along one of the columns are in contact with one of the doped regions 106.

As illustrated, the selection element 120 includes a buffer semiconductor pattern 114a and a metallic pattern 116 that are sequentially stacked. The metallic pattern 116 is in contact with an upper surface of the buffer semiconductor pattern 114a. The buffer semiconductor pattern 114a includes a bulk portion 112 and a surface portion 111 disposed between the bulk portion 112 and the metallic pattern 116. The surface portion 111 is in contact with the metallic pattern 116. The surface portion 111 is very thin as compared with the bulk portion 112. The bulk portion 112 is doped with the first conductive dopant. In particular, the bulk portion 112 may be doped using the same dopant as the doped region 106. A dopant concentration of the doped region 106 may be higher than that of the bulk portion 112. Therefore, the doped region 106 may have a higher conductivity than the bulk portion 112. The surface portion 111 is doped with the second conductive dopant.

An own work function of the metallic pattern 116 is different from that of the bulk portion 112. An interface electric potential barrier is generated on a contact surface between the metallic pattern 116 and the buffer semiconductor pattern 114a due to a difference of the own work functions. A region having an electric potential barrier higher than the interface electric potential barrier is generated in a depletion region of the buffer semiconductor pattern 114a due to the surface portion 111.

In embodiments of the present invention where the first conductive dopant is an n-type dopant and the second conductive dopant is a p-type dopant, the own work function of the metallic pattern 116 may be greater than that of the bulk portion 112. However, in some embodiments of the present invention where the first conductive dopant is p-type dopant and the second conductive dopant is a n-type dopant, the own work function of the metallic pattern 116 may be smaller than that of the bulk portion 112.

In some embodiments of the present invention, the metallic pattern 116 may be formed of a conductive material having metallic characteristic satisfying the above own work functions. The metallic pattern 116 may be formed of a metal or a metal silicide. In embodiments of the present invention where the bulk portion 112 is formed of silicon doped with an n-type dopant, the metallic pattern 116 may be formed of titanium silicide, platinum silicide, molybdenum silicide, tungsten silicide, cobalt, nickel, platinum, and/or palladium. In embodiments where the bulk portion 112 is formed of silicon doped with a p-type dopant, the metallic pattern 116 may be formed of cobalt silicide, tantalum silicide, zirconium silicide, molybdenum, zirconium and/or tantalum.

In embodiments of the present invention where the first conductive dopant is an n-type dopant and the second conductive dopant is a p-type dopant, the phase change memory device including the selection element 120 will be discussed in more detail with respect to the energy band diagram of FIG. 3.

Figure 3:
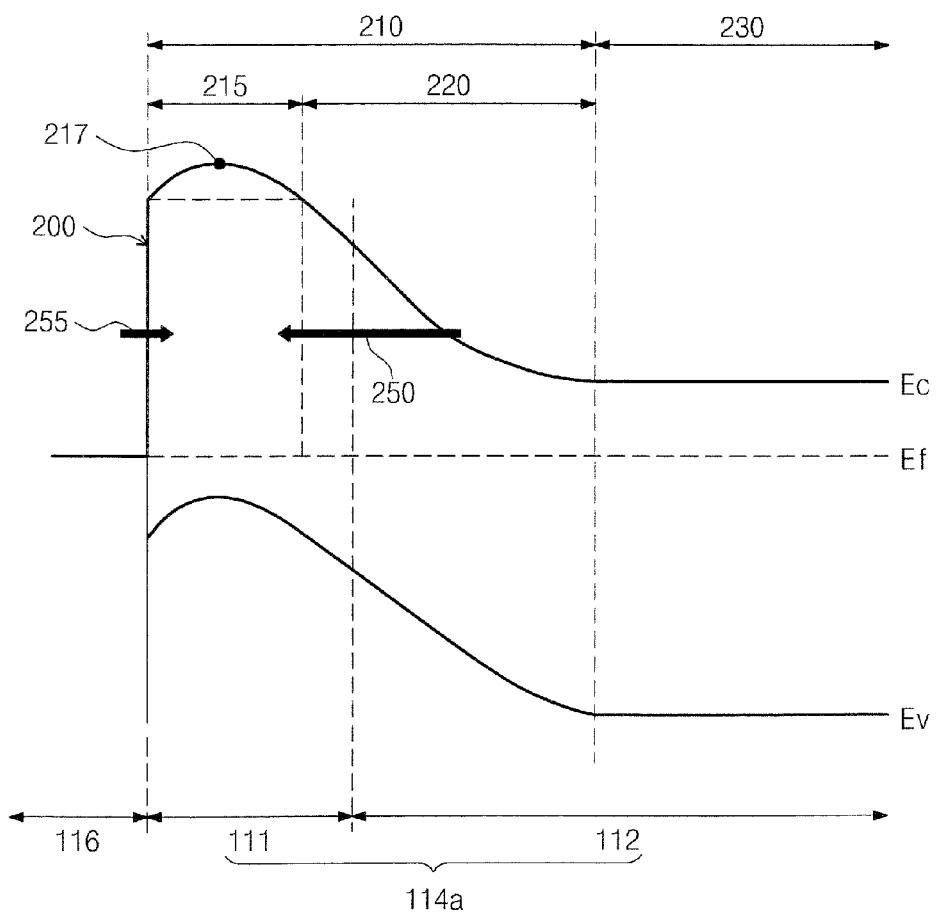
FIG. 3 is an energy band diagram taken along the line III-III' of FIG. 2A illustrating a selection element included in a phase change memory device according to some embodiments of the present invention.

Referring now to FIG. 3, an energy band diagram taken along the line III-III' of FIG. 2A illustrating a selection element included in a phase change memory device in accordance with some embodiments of the present invention will be discussed. The energy band diagram of FIG. 3 is an energy band diagram of the selection element 120 in an equilibrium state.

Referring now to FIGS. 1, 2A, 2B and 3, a conduction band and valence band of the buffer semiconductor pattern 114a are spaced apart from each other. An energy level at the bottom edge of the conduction band is referred to as a conduction energy level (Ec) and an energy level at the top edge of the valence band is referred to as a valence energy level (Ev). A Fermi level of the bulk portion 112 doped with an n-type dopant is near the conduction energy level (Ec). Fermi levels of the metallic pattern 116 and the buffer semiconductor pattern 114a are identical to each other and settled in an equilibrium state. A reference character Ef of FIG. 3 refers to a Fermi level (Ff) in the equilibrium state.

As discussed above, in embodiments of the present invention where the bulk portion 112 is doped with an n-type dopant, the own work function of the metallic pattern 116 is greater than that of the bulk portion 112. In order to be settled in the equilibrium state, electrons in the buffer semiconductor pattern 114a (particularly, electrons in the bulk portion 112) move into the metallic pattern 116 to generate a depletion region 210 in the buffer semiconductor pattern 114a. Furthermore, an interface electric potential barrier 200 against electrons is generated on the contact surface between the metallic pattern 116 and the buffer semiconductor pattern 114a.

The depletion region 210 is generated in the surface portion 111 and at least a portion of the bulk portion 112 in contact with the surface portion 111. Since the surface portion 111 is very thin, the whole surface portion 111 changes into the depletion region 210. A first internal electric field 250 which goes toward the metallic pattern 116 from the buffer semiconductor pattern 114a is generated by the depletion region 210 formed in the bulk portion 112. At this time, the surface portion 111 is doped with a p-type dopant. Thus, the surface portion 111 may reverse the first internal electric field 250 near the contact surface. In some embodiments of the present invention, the surface portion 111 has a dopant concentration which reverses the first internal electric field near the contact surface between the metallic pattern 116 and the buffer semiconductor pattern 114a. A second internal electric field 255 having a direction opposite to the first internal electric field 250 is generated near the contact surface by the surface portion 111.

A high barrier region 215 having an electric potential barrier higher than the interface electric potential barrier 200 is formed in the depletion region 210 by the first and second internal electric fields 250 and 255. The depletion region 210 includes the high barrier region 215 and a low barrier region 220. The low barrier region 220 has a low electric potential barrier as compared with the interface electric potential barrier 200. The electric potential barriers of the high and low barrier regions 215 and 220 refer to a vertical height from the Fermi level (Ef) to the conduction energy level (Ec).

The high barrier region 215 is disposed between the low barrier region 220 and the metallic pattern 116. The high barrier region 215 is in contact with the metallic pattern 116. A spot 217 having a maximum electric potential barrier is located in the high barrier region 215. The spot 217 of the maximum electric potential barrier is spaced apart from the contact surface and the low barrier region 220. As a position in the selection element 120 moves from the spot 217 of the maximum electric potential barrier toward the contact surface, an electric potential barrier in the high barrier region 215 reduces. Also, as a position in the selection element 120 moves from the spot 217 of the maximum electric potential barrier toward the low barrier region 220, an electric potential barrier in the high barrier region 215 reduces. The conduction energy level (Ec) in the high barrier region 215 may have a meniscus-shaped configuration. An electric field at the spot 217 of the maximum electric potential barrier may not exist. The spot 217 of the maximum electric potential barrier may be located in the surface portion 111. As a dopant concentration of the surface portion 111 increases, a height of the maximum electric potential barrier may increase and a width of the high barrier region 215 may increase.

The buffer semiconductor pattern 114a may include the depletion region 210 and a neutral region 230. The depletion region 210 is disposed between the metallic pattern 116 and the neutral region 230. The conduction energy level (Ec) and the valence energy level (Ev) in the neutral region 230 are flat. That is, an internal electric field does not exist in the neutral region 230. As a position in the low barrier region 220 goes away from the high barrier region 215, an electric potential barrier in the low barrier region 220 reduces.

The selection element 120 includes the interface electric potential barrier 200 generated by a contact of the metallic pattern 116 and the buffer semiconductor pattern 114a. The interface electric potential barrier 200 may be a schottky barrier. Thus, since the selection element 120 has a low threshold voltage, it has a high current efficiency. In particular, the selection element 120 may have a threshold voltage lower than a threshold voltage (ex, about 0.7V) of a PN diode. The selection element 120 reacts very fast. The selection element 120 operates in a high speed. The selection element 120 includes the high barrier region 215 having a high electric potential as compared with the interface electric potential barrier 200 in the depletion region 210. A leakage current of the selection element 120 is minimized by the high barrier region 215. The high barrier region 215 may greatly reduce a leakage current by a barrier tunneling of electrons to minimize the leakage current. Even if a reverse voltage is applied to the selection element 120, the barrier tunneling of electrons may be reduced by the high barrier region 215.

Consequently, the selection element 120 has a substantially low threshold voltage and a minimum leakage current. Furthermore, the selection element 120 operates at a high speed.

In some embodiments of the present invention where the first conductive dopant is a p-type dopant and the second conductive dopant is an n-type dopant, the phase change memory device including the selection element 120 will be discussed in more detail referring to the energy band diagram of FIG. 4.

Figure 4:
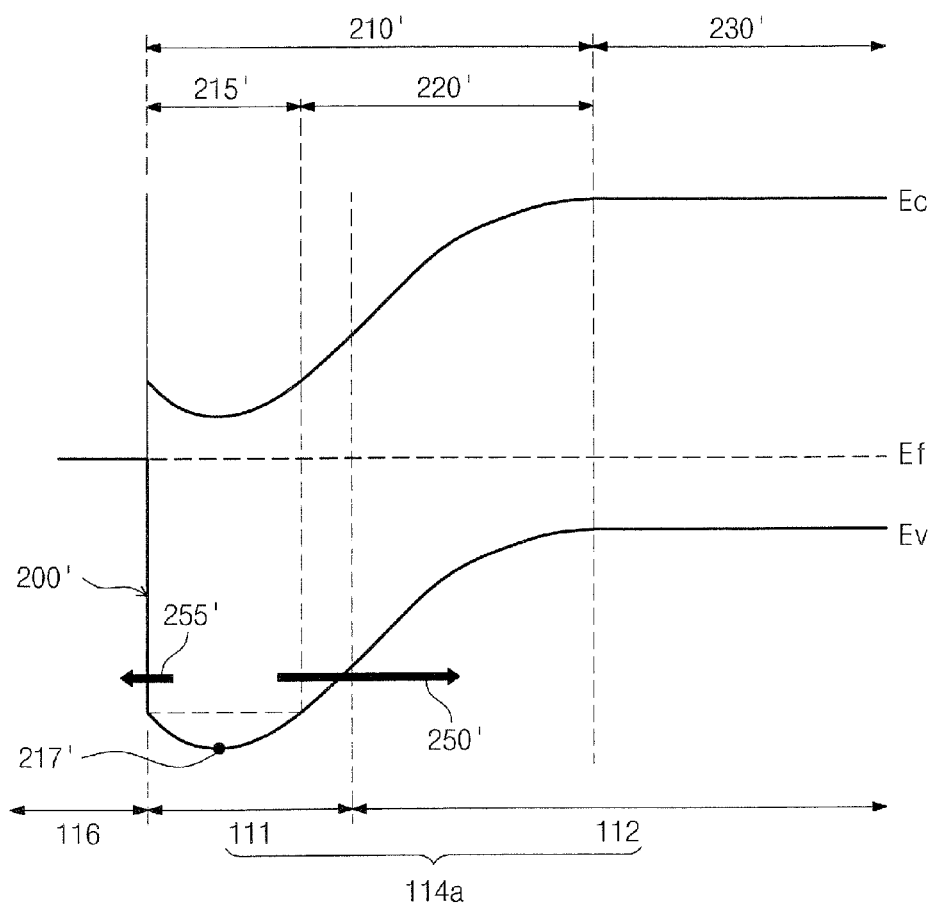
FIG. 4 is an energy band diagram taken along the line III-III' of FIG. 2A illustrating a selection element included in a phase change memory device according to some embodiments of the present invention.

Referring now to FIG. 4, an energy band diagram taken along the line III-III' of FIG. 2A illustrating a selection element included in a phase change memory device in accordance with some embodiments of the present invention. The energy band diagram of FIG. 4 is an energy band diagram of the selection element 120 of an equilibrium state.

Referring to FIGS. 1, 2A, 2B and 4, the bulk portion 112 is doped with a p-type dopant. Main carriers of the buffer semiconductor pattern 114a are holes. In embodiments of the present invention where the bulk portion 112 is doped with a p-type dopant, the own work function of the metallic pattern 116 is smaller than that of the bulk portion 112. An interface electric potential barrier 200' against holes is generated on the contact surface between the metallic pattern 116 and the buffer semiconductor pattern 114a. A depletion region 210' in contact with the metallic pattern 116 is generated in the buffer semiconductor pattern 114a. The depletion region 210' is generated on the surface portion 111 doped with an n-type dopant and a portion of the bulk portion 112 in contact with the surface portion 111.

A first internal electric field 250' is generated by the depletion region 210' in the bulk portion 112. Since the bulk portion 112 is doped with a p-type dopant, the first internal electric field 250' goes toward the buffer semiconductor pattern 114a from the metallic pattern 116. Since the surface portion 111 is doped with an n-type dopant, the first internal electric field 250' may be reversed near the contact surface. The surface portion 111 has a dopant concentration reversing the first internal electric field near the contact surface. A second internal electric field 255' is generated near the contact surface by the surface portion 111. A direction of the second internal electric field 255' is opposite to the first internal electric field 250'.

A high barrier region 215' is generated in the depletion region 210' by the first and second internal electric fields 250' and 255'. The high barrier region 215' has an electric field barrier greater than the interface electric potential barrier 200'. The depletion region 210' also includes a low barrier region 220' adjacent to the high barrier region 215'. The low barrier region 220' has an electric field barrier smaller than the interface electric potential barrier 200'. The high barrier region 215' and the interface electric potential barrier 200' are energy barriers against holes. A leakage current of the holes may be reduced by the high barrier region 215'. A spot 217' of a maximum electric potential barrier in the high barrier region 215' is spaced apart from the contact surface and the low barrier region 220'. The high barrier region 215' has a predetermined width. A valence energy level (Ev) in the high barrier region 215' may have a meniscus-shaped configuration. A neutral region 230' is disposed near the depletion region 210'. An internal electric field does not exist in the neutral region 230'.

As discussed above, in embodiments of the present invention where the first conductive dopant is a p-type dopant and the second conductive dopant is an n-type dopant, the interface electric potential barrier 200' against the holes is generated on the contact surface and the high barrier region 215' against the holes is generated in the depletion region 210'. The selection element 120 has a low threshold voltage and operates in a high speed. A leakage current of the selection element 120 due to the holes may be reduced.

Referring now to FIGS. 1, 2A and 2B, an upper surface of the metallic pattern 116 and an upper surface of the lower insulating layer 108 may be coplanar. A mold layer 122 may be disposed on the whole surface of the substrate 100. The mold layer 122 covers the metallic pattern 116 and the lower insulating layer 108. The mold layer 122 is formed of an insulating material, for example, an oxide layer. A heat plug 128 is disposed in a hole 124 penetrating the mold layer 122. The heat plug 128 is in contact with the upper surface of the metallic pattern 116. A plurality of the heat plugs 128 are arranged along the rows and the columns. The heat plugs 128 are spaced apart from each other. A plurality of the heat plugs 128 are in contact with a plurality of the upper surface of the metallic patterns 116, respectively. An upper surface of the heat plug 128 and an upper surface of the mold layer 122 may be coplanar. A width of the heat plug 128 may be smaller than that of the metallic pattern 116.

An insulating spacer 126 may be disposed between a sidewall of the hole 124 and the heat plug 128. The hole 124 may be aligned with the opening 124. A width of the hole 124 may be smaller than the upper surface of the metallic pattern 116. In these embodiments, the insulating spacer 126 may be omitted. Furthermore, in embodiments of the present invention that the width of the hole 124 is smaller than the upper surface of the metallic pattern 116, the insulating spacer 126 may be disposed between the sidewall of the hole 124 and the heat plug 128. The insulating spacer 126 may be formed of a material including at least one among oxide, nitride and oxynitride.

A plurality of phase change material patterns 130 are arranged along the rows and the columns. A plurality of the phase change material patterns 130 are in contact with a plurality of the heat plugs 128, respectively. The phase change material pattern 130 may be formed of a material including at least one between tellurium (Te) and selenium (Se) of chalcogenide element. The phase change material pattern 130 may include, for example, at least one selected from the group consisting of Ge—Sb—Te, As—Sb—Te, As—Ge—Sb—Te, Sn—Sb—Te, Ag—In—Sb—Te, In—Sb—Te, 5A group element Sb—Te, 6A group element Sb—Te, 5A group element Sb—Se, 6A group element Sb—Se, Ge—Sb, In—Sb, Ga—Sb, and doped Ge—Sb—Te. In these embodiments, the doped Ge—Sb—Te may be doped with C, N, B, Bi, Si, P, Al, Dy or Ti. The heat plug 128 may be formed of a conductive material that can apply a heat to the phase change material patterns 130, for example, TiN, TaN, WN, MoN, NbN, TiSiN, TiAlN, TiBN, ZrSiN, WSiN, WBN, ZrAlN, MoSiN, MoAlN, TaSiN, TaAlN, a conductive nitride oxide metal, for example, TiON, TiAlON, WON, TaON, a single metal, for example, Ti, Ta, Zr, Hf, Mo, Al, W, Cu, a complex metal, for example, TiAl, Al—Cu, Al—Cu—Si, TiW, and a conductive metal silicide, for example, WSi.

A capping conductive pattern 132 may be disposed on the phase change material patterns 130. The capping conductive pattern 132 may have a sidewall aligned with the sidewall of the phase change material patterns 130. The capping conductive pattern 132 may be formed of a material including at least one selected from the group consisting of a conductive nitride metal, for example, TiN, TaN, WN, MoN, NbN, TiSiN, TiAlN, TiBN, ZrSiN, WSiN, WBN, ZrAlN, MoSiN, MoAlN, TaSiN, TaAlN, a conductive nitride oxide metal, for example, TiON, TiAlON, WON, TaON, a single metal, for example, Ti, Ta, Zr, Hf, Mo, Al, W, Cu, a complex metal, for example, TiAl, Al—Cu, Al—Cu—Si, TiW, and a conductive metal silicide, for example, WSi.

An upper insulating layer 134 is disposed on the surface of the substrate 100. The upper insulating layer 134 is provided on the mold layer 122, the phase change material pattern 130 and the capping conductive pattern 132. The upper insulating layer 134 may be formed of an oxide layer.

A plurality of interconnection plugs 138 fill a plurality of interconnection holes 136 penetrating the upper insulating layer 134, respectively. The interconnection plugs 138 are arranged along the rows and the columns. The interconnection plugs 138 are in contact with the capping conductive patterns 132, respectively. A plurality of interconnections 140 are arranged in parallel with each other on the upper insulating layer 134. A plurality of the interconnections 140 extend along the second direction. In particular, a plurality of the interconnections 140 extend across the doped region 106. The interconnection 140 is in contact with the interconnection plug 138 arranged along the row. The interconnection 140 goes through the interconnection plug 138 and is electrically connected to the phase change material pattern 130.

One of phase change memory cells may be selected using the interconnection 140 and the doped region 106. One of the interconnection 140 and the doped region 106 corresponds to a bit line and the other corresponds to a word line. The interconnection plug 138 may include at least one of doped polysilicon and metal, for example, tungsten, copper and aluminum. The interconnection line 140 may include, for example, at least one of tungsten, copper and aluminum. The interconnection plug 138 and the interconnection line 140 may further include a diffusion barrier.

As discussed above, the selection element 120 has a low threshold voltage, leading to a high current efficiency. Therefore, the selection element 120 may sufficiently guarantee an operation current required for a program operation and/or an erase operation of the phase change memory cell. As a result, a highly integrated phase change memory device may be realized. The selection element 120 operates in a high speed, which can lead to a high speed phase change memory device. Additionally, the presence of the high barrier region 215' may provide a reduced leakage current of the selection device 120. Thus, a phase change memory device having reduced power consumption may be realized.

In some embodiments of the present invention, the heat plug 128 may be disposed in the opening 110 together with the selection element 120. In these embodiments, the mold layer 122 may not be required.

Figure 5:
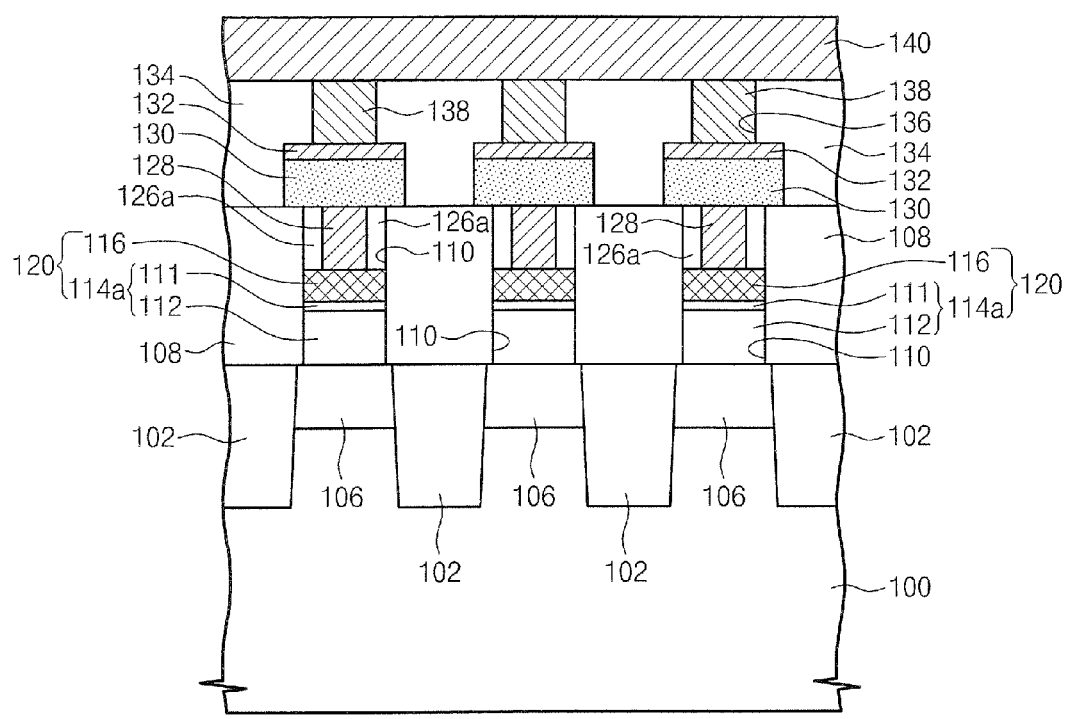
FIG. 5 is a cross section taken along the line I-I' of FIG. 1 illustrating phase change memory devices in accordance with some embodiments of the present invention.

Referring now to FIG. 5, a cross section taken along the line I-I' of FIG. 1 illustrating a phase change memory device in accordance with some embodiments of the present invention will be discussed. As illustrated in FIG. 5, a buffer semiconductor pattern 114a and a metallic pattern 116 that are sequentially stacked are disposed in an opening 110 penetrating a lower insulating layer 108. An upper surface of the metallic pattern 116 is lower than that of the lower insulating layer 108. In particular, the buffer semiconductor pattern 114a and the metallic pattern 116 fill a lower portion of the opening 110.

A heat plug 128 is disposed in the opening 110 on the metallic pattern 116. An upper surface of the heat plug 128 and an upper surface of the lower insulating layer 108 may be coplanar. In some embodiments, an insulating spacer 126a is disposed between the heat plug 128 and a sidewall of the opening 110. The heat plug 128 has a high resistance to reduce an operation current required for a program operation and an erase operation.

The phase change material pattern 130 is disposed on the lower insulating layer 108 and in contact with the upper surface of the heat plug 128. A capping conductive pattern 132 is disposed on the phase change material pattern 130. An upper insulating layer 134 is provided on the lower insulating layer 108, the phase change material pattern 130 and the capping conductive pattern 132. The mold layer 122 illustrated in FIGS. 2A and 2B may be omitted in embodiments of the present invention illustrated in FIG. 5. Thus, a structure and a manufacturing process of the phase change memory device may be simplified. Furthermore, a productivity of the phase change memory device may be improved.

Figure 6:
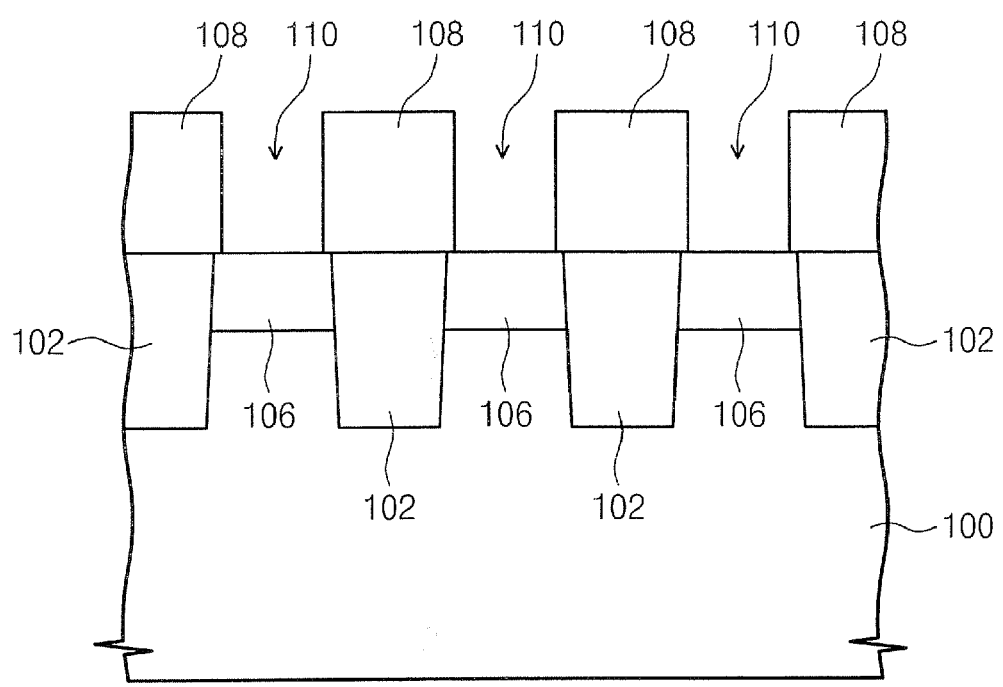
FIG. 6 through 9 are cross sections taken along the line I-I' of FIG. 1 illustrating processing steps in the fabrication of phase change memory devices in accordance with some embodiments of the present invention.

Referring now to FIGS. 6 through 9, cross sections taken along the line I-I' of FIG. 1 illustrating processing steps in the fabrication of phase change memory devices in accordance with some embodiments of the present invention will be discussed. Referring first to FIG. 6, a device isolation layer 102 is formed in a substrate 100 to define a plurality of active regions (104 of FIG. 1). First conductive dopant ions are implanted into the active regions to form doped regions 106. The active regions are doped with a second conductive dopant. A lower insulating layer 108 is formed on the surface of the substrate 100. The lower insulating layer 108 is patterned to form openings 110 exposing the doped regions 106.

Figure 7:
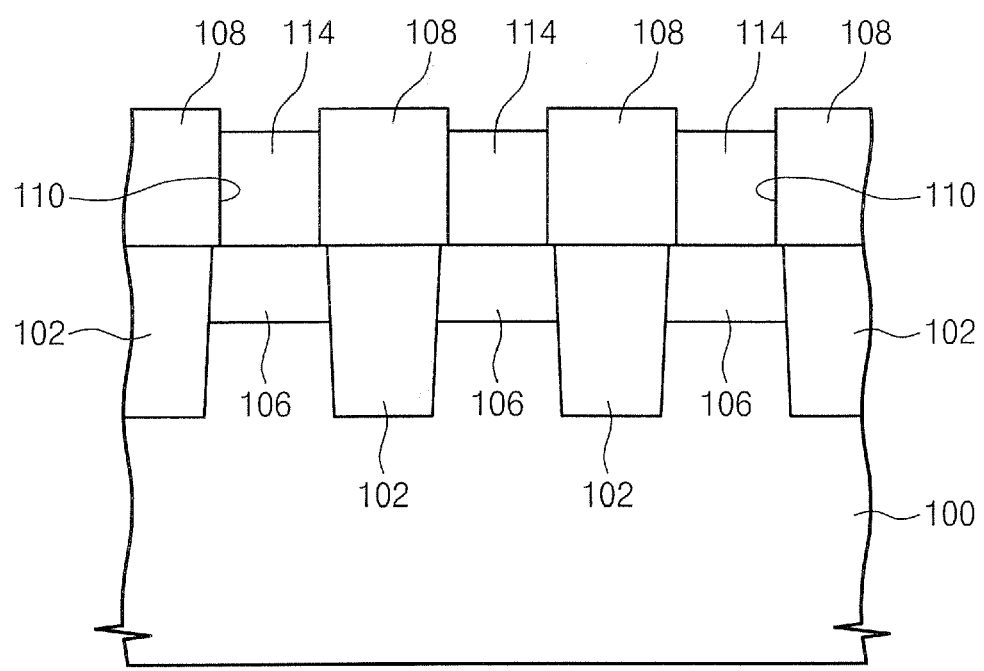

Referring now to FIG. 7, a preliminary buffer semiconductor pattern 114 doped with a first conductive dopant is formed in the opening 110. The preliminary buffer semiconductor pattern 114 may be formed by means of a selective epitaxy growth process. In these embodiments of the present invention, the preliminary buffer semiconductor pattern 114 may be formed to have a single crystalline structure. In some embodiments of the present invention, a semiconductor layer filling the opening 110 is formed on the surface of the substrate 100 by means of a chemical vapor deposition (CVD) process and the semiconductor layer is etched back to form the preliminary buffer semiconductor pattern 114. In some embodiments, the preliminary buffer semiconductor pattern 114 may be formed to have a polycrystalline structure. An upper surface of the preliminary buffer semiconductor pattern 114 may be formed to be lower than an upper surface of the lower insulating layer 108. The preliminary buffer semiconductor pattern 114 may be doped by an in-situ method or an ion implantation method without departing from the scope of the present application.

Figure 8:
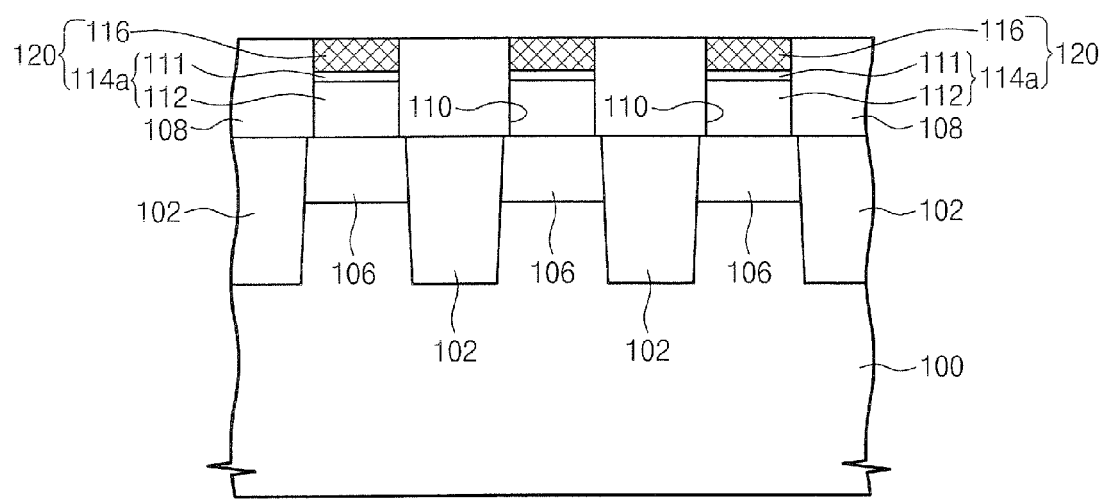

Referring now to FIG. 8, a selection element 120 is formed in the opening 110. The selection element 120 includes a buffer semiconductor pattern 114a and a metallic pattern 116 that are sequentially stacked. The metallic pattern 116 is in contact with an upper surface of the buffer semiconductor pattern 114a. The buffer semiconductor pattern 114a includes a bulk portion 112 doped with a first conductive dopant and a surface portion 111 doped with a second conductive dopant. The surface portion 111 is disposed between the bulk portion 112 and the metallic pattern 116 and in contact with the metallic pattern 116. The surface portion 111 is formed to have a small thickness on the upper surface of the buffer semiconductor pattern 114a.

The metallic pattern 116 may be formed by applying a silicidation process to an upper portion of the preliminary buffer semiconductor pattern 114. In particular, a metal layer is formed on the substrate 100 including the preliminary buffer semiconductor pattern 114. The metallic pattern 116 that is limited to the opening 110 may be formed by applying a silicidation process to the metal layer and the preliminary buffer semiconductor pattern 114. The remaining metal layer that does not react is removed. A lower portion of the preliminary buffer semiconductor pattern 114 remains under the metallic pattern 116. The surface portion may be formed by implanting second conductive dopant ions through the opening 110. After the metallic pattern 116 is formed, the second conductive dopant ions are implanted into an upper surface of the remaining preliminary buffer semiconductor pattern 114 through the opening 110 to form the surface portion 111. In some embodiments of the present invention, before the metallic pattern 116 is formed, second conductive dopant ions are implanted into a middle portion of the remaining preliminary buffer semiconductor pattern 114 to form the surface portion 111. When the silicidation process for forming the metallic pattern 116 is performed, the preliminary buffer semiconductor pattern 114 on the surface portion 111 and a portion of the surface portion 111 may react to the metal layer.

The metallic pattern 116 may be formed using another method. In particular, the buffer semiconductor pattern 114a filling a lower portion of the opening 110 is formed and a metallic layer filling an upper portion of the opening 110 is formed on the surface of the substrate 100. The metallic layer is planarized down to the upper surface of the lower insulating layer 108 to form the metallic pattern 116. The surface portion 111 may be formed before or after the metallic pattern 116 is formed. The surface portion 111 may be doped using an in-situ method. In these embodiments, the surface portion 111 is formed before the metallic pattern 116 is formed.

Figure 9:
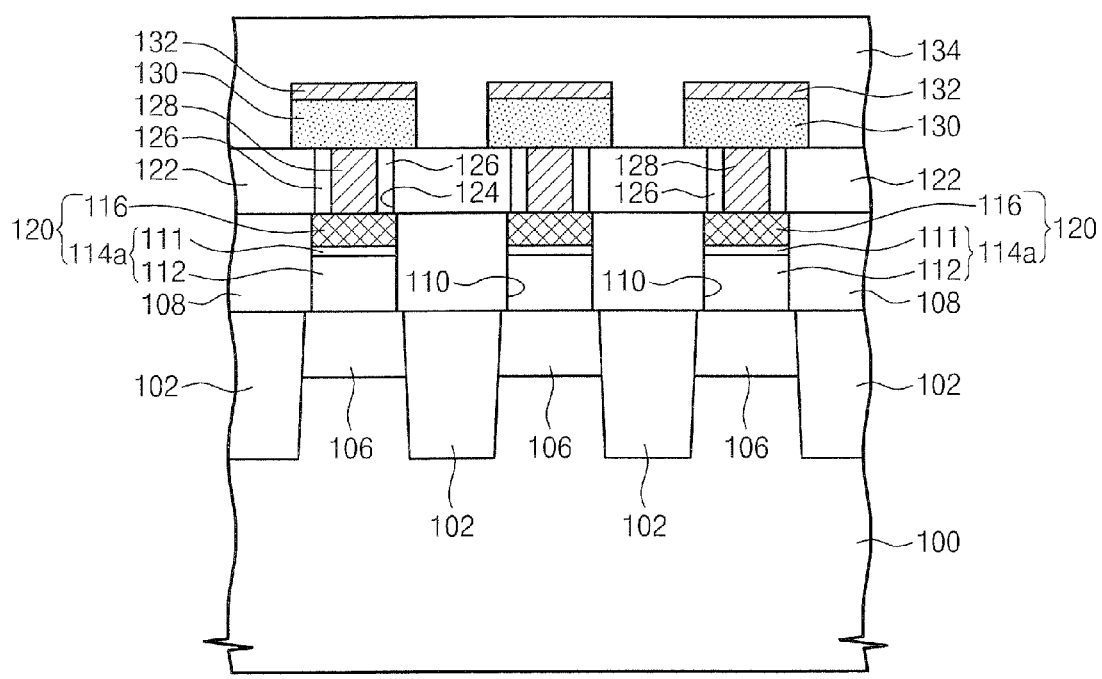

Referring to FIG. 9, a mold layer 122 is formed on the surface of the substrate 100. The mold layer 122 is patterned to form a hole 124 exposing the metallic pattern 116. An insulating spacer 126 is formed on a sidewall of the hole 124. A heat layer filling the hole 124 is formed on the substrate 100 including the insulating spacer 126. The heat layer is planarized down to the upper surface of the mold layer 122 to form a heat plug 128 in the hole 124.

A phase change material layer and a capping conductive layer are sequentially formed on the mold layer 122. The capping conductive layer and the phase change material layer are sequentially patterned to form a phase change material pattern 130 and a capping conductive pattern 132. The phase change material pattern 130 is in contact with an upper surface of the heat plug 128.

An upper insulating layer 134 is formed on the whole surface of the substrate 100. The upper insulating layer 134 is patterned to form an interconnection hole (136 of FIGS. 2A and 2B). An interconnection plug (138 of FIGS. 2A and 2B) filling the interconnection hole is formed and an interconnection line (140 of FIGS. 2A and 2B) is formed on the upper insulating layer 134. The phase change memory device shown in FIGS. 2A and 2B may be hereby embodied.

Processing steps in the fabrication of the phase change memory device illustrated in FIG. 5 will be discussed below with reference to FIGS. 10 and 11. The above method may include the method described with reference to FIG. 6.

Figure 10:
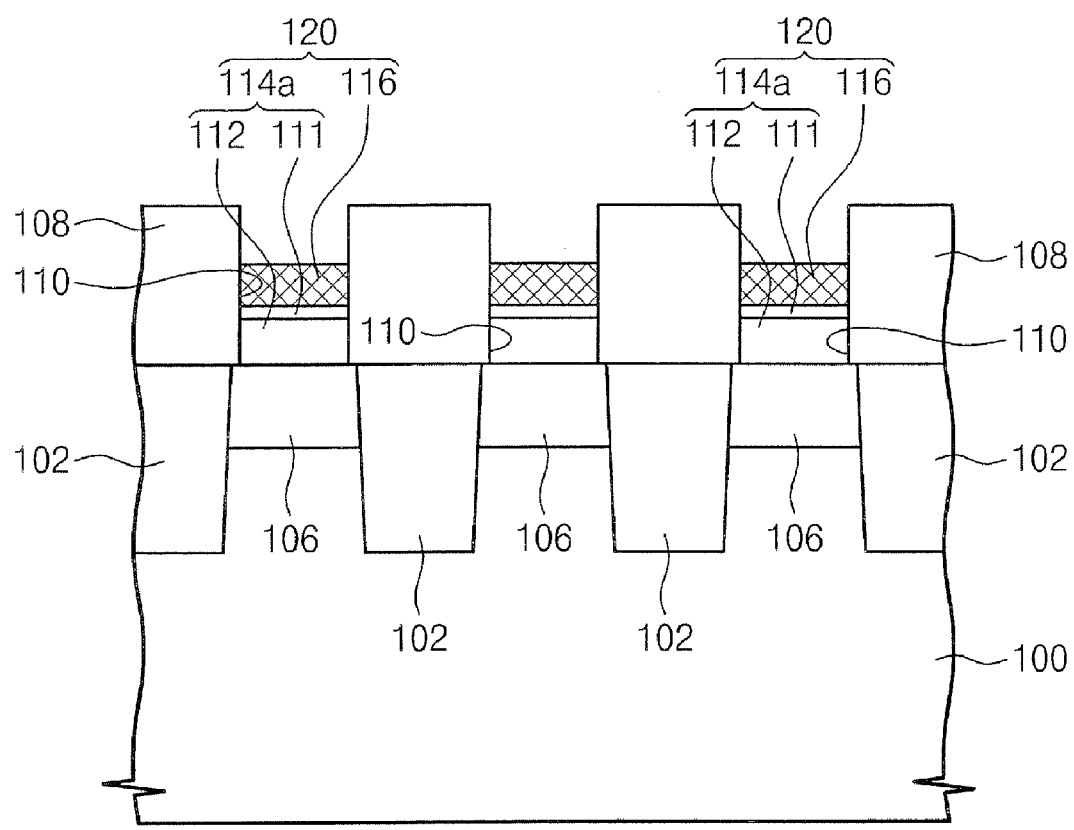
FIGS. 10 and 11 are cross sections taken along the line I-I' of FIG. 1 illustrating processing steps in the fabrication of the phase change memory device of FIG. 5.
Figure 11:
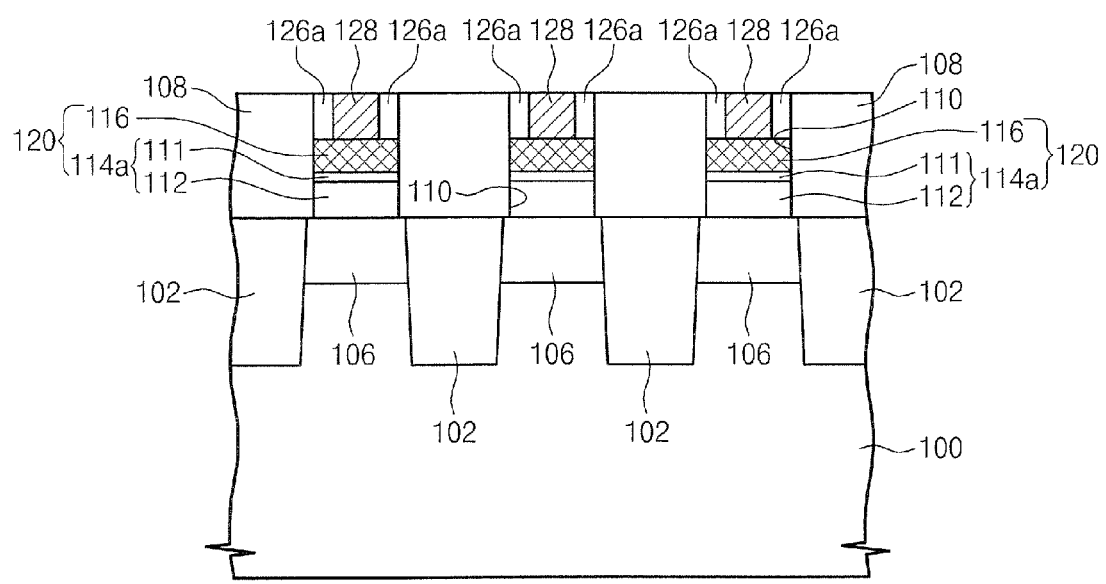

Referring now to FIGS. 10 and 11, cross sections taken along the line I-I' of FIG. 1 illustrating processing steps in the fabrication of phase change memory device of FIG. 6. Referring first to FIGS. 6 and 10, a selection element 120 is formed in an opening 110. An upper surface of a metallic pattern 116 included in the selection element 120 is formed to be lower than an upper surface of the lower insulating layer 108. In particular, the opening 110 on the selection element 120 is open. A method of forming the selection element 120 may be similar to the method illustrated in FIG. 7 and a process of recessing an upper surface of the metallic pattern 116.

Referring to FIG. 11, an insulating spacer 126a is formed on a sidewall of an upper portion of the opening 110. A heat layer filling the opening 110 is formed on the substrate 100 including the insulating spacer 126a. The heat layer is planarized down to the upper surface of the lower insulating layer 108 to form a heat plug 128. The heat plug 128 is formed in the opening on the metallic pattern 116.

The phase change material pattern 130 and the capping conductive pattern 132 of FIG. 5 are formed on the lower insulating layer 108. The method of forming the phase change material pattern 130 and the capping conductive pattern 132 and methods after this may be performed using methods similar to the methods illustrated in FIG. 9.

According to processing steps illustrated in FIGS. 10 and 11, the selection element 120 and the heat plug 128 are self-aligned with each other by the opening 110. Furthermore, the method does not require the formation of the mold layer 122 and the hole 124 of FIG. 9. Thus, a manufacturing process using these embodiments of the present invention may be simplified and a process margin may be sufficiently obtained.

Some embodiments of the present invention release a phase change memory device including a selection element of a different shape. The phase change memory device according to these embodiments of the present invention may be similar to embodiments of the present invention discussed above. Like reference numerals refer to like elements throughout the specification and therefore details with respect to like elements may not be discussed further herein.

Figure 12:
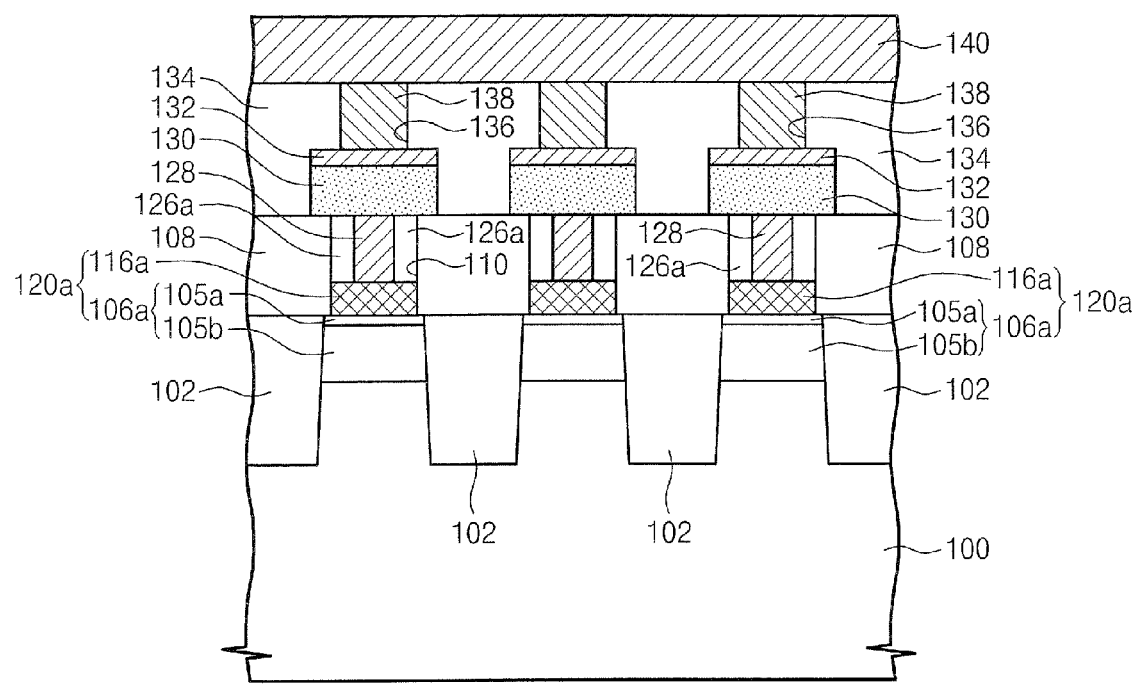
FIG. 12 is a cross section taken along the line I-I' of FIG. 1 illustrating a phase change memory device in accordance with some embodiments of the present invention.

Referring now to FIG. 12, a cross section taken along the line I-I' of FIG. 1 illustrating phase change memory devices in accordance with some embodiments of the present invention will be discussed. As illustrated in FIGS. 1 and 12, a device isolation layer 102 that defines an active region 104 is disposed in a substrate 100. A doped region 106a is disposed in the active region 104. A lower insulating layer 108 covers the whole surface of the substrate 100 and a metallic pattern 116a is disposed in an opening 110 penetrating the metallic pattern 116a. The metallic pattern 116a is in contact with the doped region 106a under the opening 110. A selection element 120a includes the metallic pattern 116a and the doped region 106a which are in contact with each other.

The doped region 106a includes a surface portion 105a and a bulk portion 105b. The surface portion 105a is disposed between the bulk portion 105b and the metallic pattern 116a. The surface portion 105a is disposed on a contact surface between the doped region 106a and the metallic pattern 116a, and the bulk portion 105b is disposed under the surface portion 105a. The bulk portion 105b extends along a first direction. The surface portion 105a may not exist between the bulk portion 105b and the lower insulating layer 108 between the metallic patterns 116a. The bulk portion 105b is doped with a first conductive dopant and the surface portion 105a is doped with a second conductive dopant. The substrate 100 is doped with the second conductive dopant.

An interface electric potential barrier (that is, schottky barrier) is generated on a contact surface between the metallic pattern 116a and the doped region 106a and a depletion region is generated in the doped region 106a. The depletion region is in contact with the metallic pattern 116a. The depletion region is generated in the surface portion 105a and in a portion of the bulk portion 105b that is in contact with the surface portion 105a. The overall surface portion 105a changes into the depletion region.

As discussed above, the depletion region includes a high barrier region having an electric potential barrier higher than the interface electric potential barrier and a low barrier region having an electric potential barrier lower than the interface electric potential barrier. The high barrier region is disposed between the metallic pattern 116a and the low barrier region. A spot having a maximum electric potential barrier in the high barrier region is spaced apart from the low barrier region and the contact surface. The selection element 120a may have the same characteristic as the selection element 120 of the first embodiment described above.

An upper surface of the metallic pattern 116a may be lower than an upper surface of the lower insulating layer. A heat plug 128 is disposed in the opening 110 on the metallic pattern 116a. An upper surface of the heat plug 128 and the upper surface of the lower insulating layer 108 may be coplanar. An insulating spacer 126a may be disposed between the heat plug 128 and a sidewall of the opening 110. A width of the heat plug 128 becomes small as compared with a width of the upper surface of the metallic pattern 116a to reduce an operation current of the phase change memory cell.

A phase change material pattern 130 and a capping conductive pattern 132 are sequentially stacked on the lower insulating layer 108. The phase change material pattern 130 is in contact with the upper surface of the heat plug 128. An upper insulating layer 134 covers the lower insulating layer 108, the phase change material pattern 130 and capping conductive pattern 132. An interconnection plug 138 is provided in an interconnection hole 136 that penetrates the upper insulating layer 134 and in contact with the capping conductive pattern 132. An interconnection line 140 is arranged on the upper insulating layer 134 and in contact with the interconnection plug 138.

The above phase change memory device may obtain the effects discussed above with respect to FIGS. 1 through 11. Furthermore, the metallic pattern 116a is in contact with the doped region 106a to form the selection element 120a. Accordingly, phase change memory device having a simpler structure may be provided.

Figure 13:
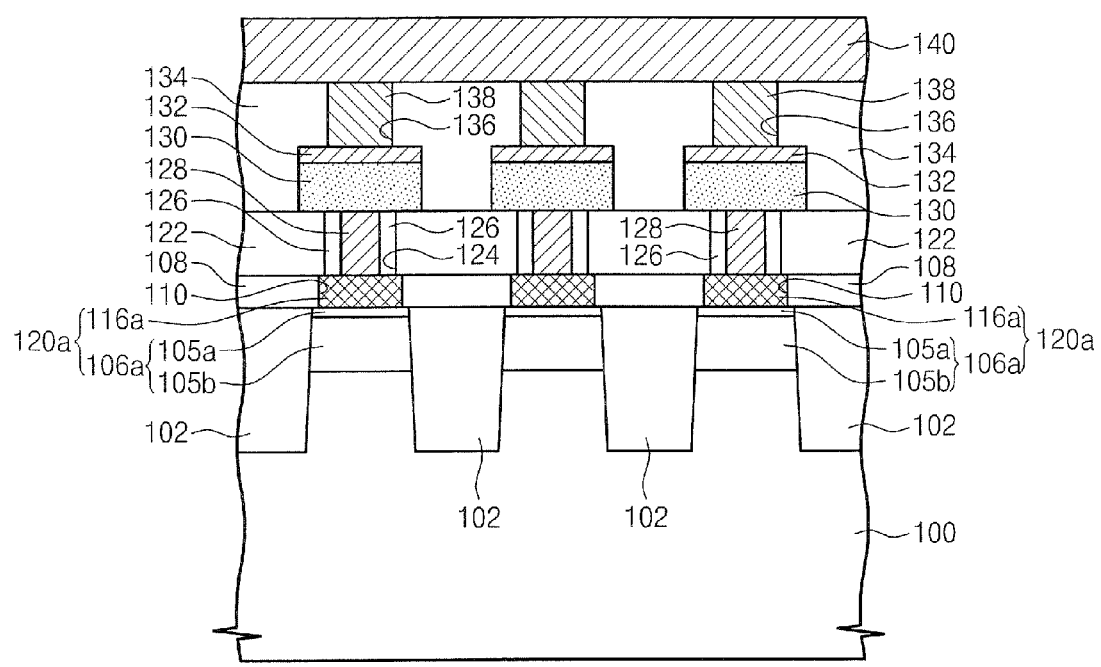
FIG. 13 is a cross section taken along the line I-I' of FIG. 1 illustrating phase change memory devices in accordance with some embodiments of the present invention.

Referring now to FIG. 13, a cross section taken along the line I-I' of Figure illustrating a phase change memory device in accordance with some embodiments of the present invention. As illustrated in FIG. 13, it is characteristic of a phase change memory device according to some embodiments that a heat plug 128 and a metallic pattern 116a are disposed in different layers. In particular, the metallic pattern 116a is disposed in an opening 110 that penetrates a lower insulating layer 108. An upper surface of the metallic pattern 116a and an upper surface of the lower insulating layer 108 have a common surface.

A mold layer 122 of an insulating material is provided on the surface of the substrate 100. A heat plug 128 is disposed in a hole 124 that penetrates the mold layer 122 and in contact with the metallic pattern 116a. An insulating spacer 126 may be disposed between the heat plug 128 and a sidewall of the hole 124. In embodiments of the present invention where a width of the hole 124 is smaller than a width of the upper surface of the metallic pattern 116a, the insulating spacer 126 may be omitted.

A phase change material pattern 130 is disposed on the mold layer 122 and in contact with an upper surface of the heat plug 128. A capping conductive pattern 132, an upper insulating layer 134, an interconnection plug 138 and an interconnection line 140 may be to those like elements discussed above with respect to FIGS. 1 through 11.

Figure 14:
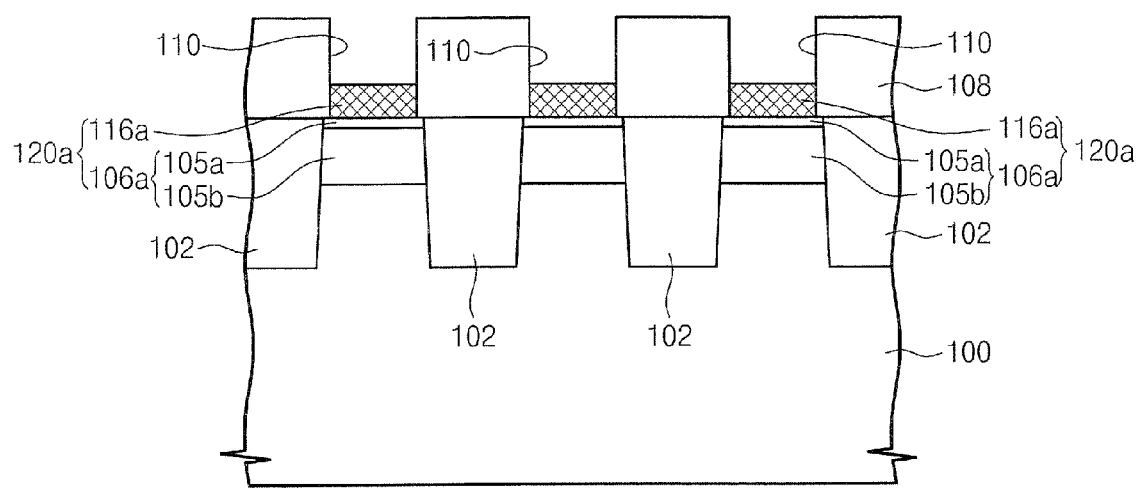
FIGS. 14 and 15 are cross sections taken along the line I-I' of FIG. 1 illustrating processing steps in the fabrication of phase change memory devices in accordance with some embodiments of the present invention.
Figure 15:
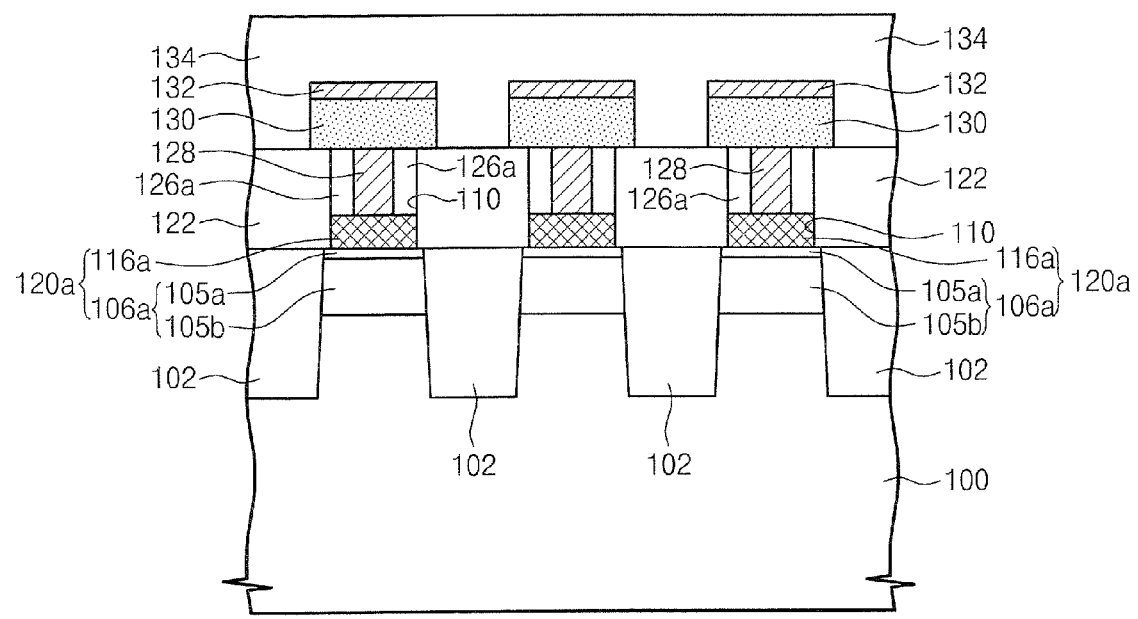

Referring now to FIGS. 14 and 15, cross sections taken along the line I-I' of FIG. 1 illustrating processing steps in the fabrication of phase change memory devices in accordance with some embodiments of the present invention. As illustrated in FIG. 14, a device isolation layer 102 is formed in a substrate 100 to define an active region. A first conductive dopant is implanted into the active region to form a preliminary doped region. The active region is doped with a second conductive dopant before the first conductive dopant is implanted into the active region. The preliminary doped region extends along the active region.

A lower insulating layer 108 is formed on the substrate 100 including the preliminary doped region. The lower insulating layer 108 is patterned to form openings 110 that expose the preliminary doped region. The second conductive dopant is implanted into the exposed preliminary doped region to form a surface portion 105a. A doped region 106 including the surface portion 105a and a bulk portion 105b is formed. A metallic pattern 116a in contact with the doped region 106 is formed in the opening 110. A selection element 120a includes the metallic pattern 116a and the doped region 106. An upper surface of the metallic pattern 116a may be formed to be lower than an upper surface of the lower insulating layer 108.

As discussed above, the surface portion 105a may be formed before the metallic pattern 116a is formed. In some embodiments, the surface portion 105a may be formed after the metallic pattern 116a is formed. In particular, the metallic pattern 116a in contact with the preliminary doped region is formed in the opening 110. The second conductive dopant ions are implanted near the contact surface of the preliminary doped region through the opening 110 to form the surface portion 105a.

A metallic layer in the opening 110 is deposited on the surface of the substrate 100. The metallic layer is planarized down to the upper surface of the lower insulating layer 108. An upper surface of the planarized metallic layer is recessed to form the metallic pattern 116a.

In some embodiments of the present invention, the metallic pattern 116a may be formed using a silicidation process. A metallic layer is formed on the substrate 100 including the opening 110. The metallic layer reacts with a portion of the preliminary doped region to form the metallic pattern 116a. The remaining metallic layer that does not react may be removed. An auxiliary semiconductor layer filling a lower portion of the opening 110 is formed. The auxiliary semiconductor layer reacts with the metallic layer to form the metallic pattern 116a. In this case, a loss of the doped region 106a is minimized. The auxiliary semiconductor layer may be formed by means of a selective epitaxial growth or a deposition/etch back process.

Referring now to FIG. 15, an insulating spacer 126a is formed on a sidewall of the opening 110 on the metallic pattern 116a. A heat layer is formed on the substrate 100 including the insulating spacer 126a. The heat layer is planarized down to the upper surface of the lower insulating layer 108 to form a heat plug 128.

A phase change material pattern 130 and a capping conductive pattern 132 that are sequentially stacked are formed on the lower insulating layer 108. The phase change material pattern 130 is in contact with an upper surface of the heat plug 128. An upper insulating layer 134 is formed to cover the whole surface of the substrate 100. Processes after this may be performed using the similar methods to those discussed above with respect to FIGS. 1 through 11. The phase change memory device shown in FIG. 12 may be hereby embodied.

Figure 17:
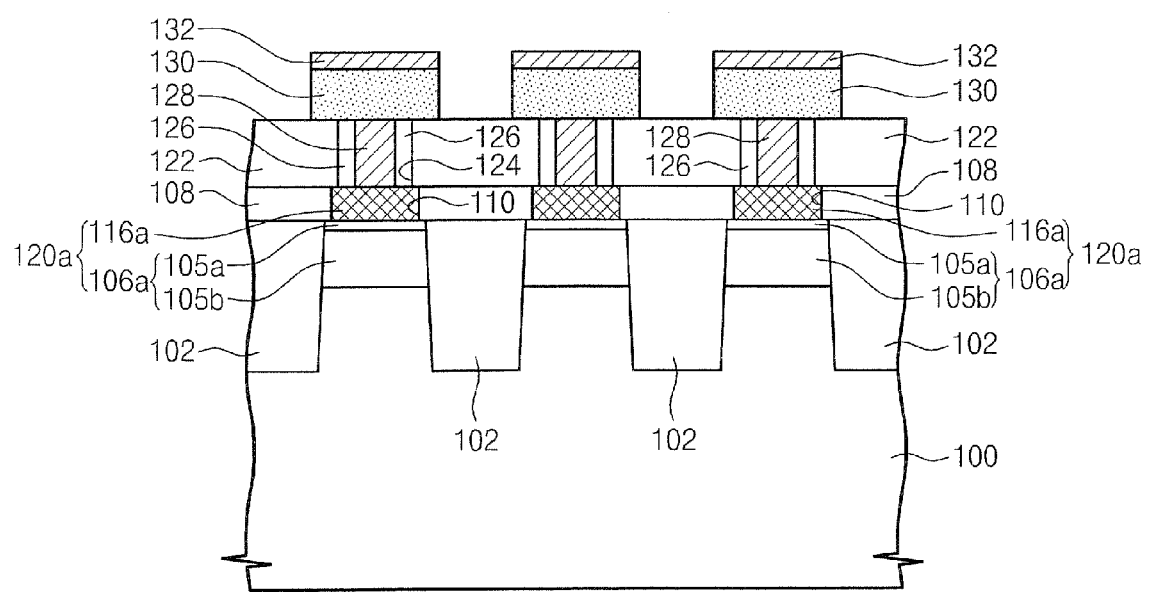

Processing steps in the fabrication of the phase change memory device shown in FIG. 13 is described with reference to the drawings. Referring now to FIGS. 6 and 17, cross sections taken along the line I-I' of FIG. 1 illustrating processing steps in the fabrication of a phase change memory device of FIG. 13 will be discussed.

Figure 16:
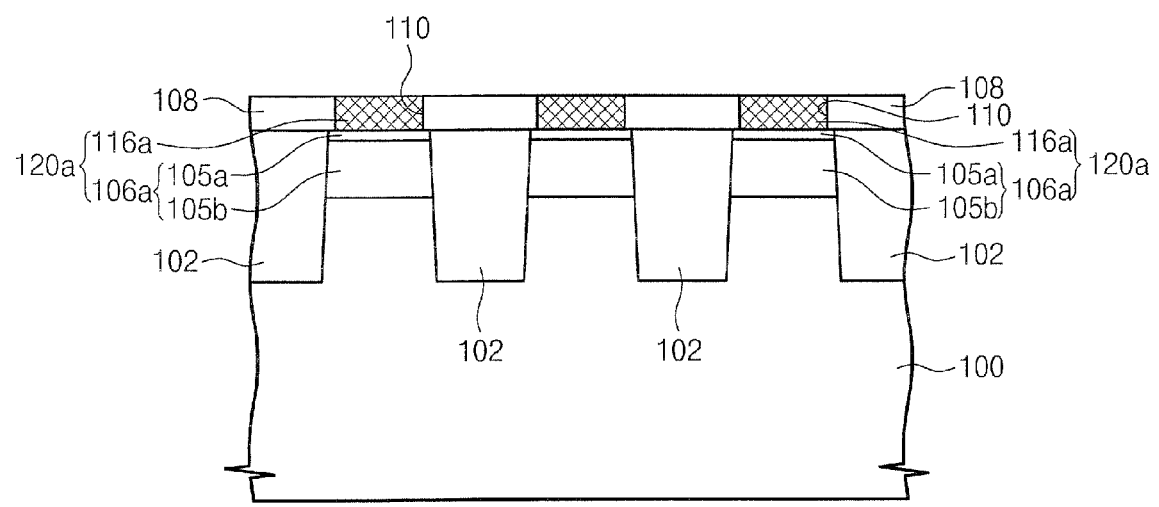
FIGS. 16 and 17 are cross sections taken along the line I-I' of FIG. 1 illustrating processing steps in the fabrication of the phase change memory device of Figure.

As illustrated in FIG. 16, a metallic pattern 116a is formed in an opening 110 that penetrates a lower insulating layer 108. An upper surface of the metallic pattern 116a and an upper surface of the lower insulating layer 108 may be coplanar. Processing steps for forming a selection element 120a including the metallic pattern 116a and a doped region 106a may be similar to those discussed above with respect FIG. 15 in that the process of recessing the upper surface of the metallic pattern 116a may be omitted.

Referring to FIG. 17, a mold layer 122 is formed on the surface of the substrate 100. The mold layer 122 is patterned to form a hole 124 that exposes the metallic pattern 116a. An insulating spacer 126 may be formed on a sidewall of the hole 124. A heat layer filling the hole 124 is formed on the substrate 100 including the insulating spacer 126. The heat layer is planarized down to the upper surface of the mold layer 122 to form a heat plug 128. In embodiments of the present invention where a width of the hole 124 is smaller than a width of the metallic pattern 116a, a process of forming the insulating spacer 126 can be omitted.

A phase change material pattern 130 and a capping conductive pattern 132 are sequentially stacked on the mold layer 122. The phase change material pattern 130 is in contact with an upper surface of the heat plug 128. Processes after this may be performed using the methods similar to those discussed above.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. A phase change memory device, comprising:
   a selection element including a metallic conductor and a semiconductor that are in direct contact with each other; and
   a phase change material pattern electrically connected to the selection element, wherein a depletion region in direct contact with the metallic conductor is generated in the semiconductor in an equilibrium state; and
   wherein the depletion region includes a low barrier region and a high barrier region, the low barrier region having an electric potential barrier lower than an interface electric potential barrier generated in a contact surface between the metallic conductor and the semiconductor, and the high barrier region being disposed between the low barrier region and the metallic conductor and having an electric potential barrier higher than the interface electric potential barrier.

2. The memory device of claim 1, wherein a spot having a maximum electric potential barrier is disposed in the high barrier region and is spaced apart from the contact surface and the low barrier region.

3. The memory device of claim 2:
   wherein as a position in the selection element moves from the spot having the maximum electric potential barrier toward the contact surface, the electric potential barrier in the high barrier region reduces; and wherein as a position in the selection element moves from the spot having the maximum electric potential barrier toward the low barrier region, the electric potential barrier in the high barrier region reduces.

4. The memory device of claim 1, wherein the semiconductor includes a bulk portion doped with a first conductive dopant, and a surface portion disposed between the metallic conductor and the bulk portion and doped with a second conductive dopant, wherein the depletion region is generated in the entire surface portion and a portion of the bulk portion adjacent to the surface portion.

5. The memory device of claim 4, wherein a spot having a maximum electric potential barrier in the high barrier region is disposed in the surface portion.

6. The memory device of claim 4, wherein the surface portion has a dopant concentration that reverses an internal electric field at the contact surface, the internal electric field being generated by the depletion region formed in the bulk portion.

7. The memory device of claim 4, wherein the first conductive dopant is an n-type dopant and the second conductive dopant is a p-type dopant, wherein an own work function of the metallic conductor is greater than an own work function of the bulk portion.

8. The memory device of claim 4, wherein the first conductive dopant is a p-type dopant and the second conductive dopant is an n-type dopant, wherein an own work function of the metallic conductor is smaller than an own work function of the bulk portion.

9. The memory device of claim 1, further comprising a heat plug disposed between the metallic conductor and the phase change material pattern, wherein the phase change material pattern is electrically connected to the metallic conductor via the heat plug.

10. A phase change memory device, comprising:
a substrate;
a selection element including a semiconductor pattern and a metallic pattern that are in direct contact with each other on the substrate; and
a phase change material pattern electrically connected to the selection element on the substrate, wherein the semiconductor pattern includes a bulk portion doped with a first conductive dopant, and a surface portion disposed between the metallic pattern and the bulk portion and doped with a second conductive dopant, wherein a depletion region is generated in the entire surface portion and a portion of the bulk portion adjacent to the surface portion in an equilibrium state and wherein the depletion region is in direct contact with the metallic pattern.

11. The memory device of claim 10, wherein the surface portion has a dopant concentration that reverses an internal electric field at the contact surface, the internal electric field generated by the depletion region formed in the bulk portion.

12. The memory device of claim 10, further comprising an insulating layer disposed on the substrate, wherein the metallic pattern is disposed in an opening penetrating the insulating layer, and wherein the phase change material pattern is disposed on the insulating layer and electrically connected to the metallic pattern.

13. The memory device of claim 12, wherein the semiconductor pattern includes a buffer semiconductor pattern disposed in the opening under the metallic pattern, wherein the surface portion is formed at an upper surface of the buffer semiconductor pattern, the metallic pattern is in contact with the upper surface of the buffer semiconductor pattern and the bulk portion includes a portion of the buffer semiconductor pattern disposed under the surface portion.

14. The memory device of claim 13, further comprising a doped region that is formed in the substrate and doped with the first conductive dopant, wherein the buffer semiconductor pattern is in contact with the doped region.

15. The memory device of claim 12, wherein the semiconductor pattern includes the doped region formed in the substrate, wherein the metallic pattern is in contact with the doped region, the surface portion is formed at a surface of the doped region that is in contact with the metallic pattern, and the bulk portion includes a portion of the doped region under the surface portion.

16. The memory device of claim 12, further comprising a heat plug disposed between the metallic pattern and the phase change material pattern, wherein the heat plug is in contact with the metallic pattern and the phase change material pattern.

17. The memory device of claim 16, wherein the heat plug is disposed in the opening on the metallic pattern.

18. The memory device of claim 16, further comprising a mold layer that is disposed between the insulating layer and the phase change material pattern, wherein the mold layer is formed of an insulating material, and the heat plug is disposed in a hole that penetrates the mold layer and exposes the metallic pattern.

19. The memory device of claim 10, wherein the first conductive dopant is an n-type dopant and the second conductive dopant is a p-type dopant, wherein an own work function of the metallic pattern is greater than an own work function of the bulk portion.

20. The memory device of claim 10, wherein the first conductive dopant is a p-type dopant and the second conductive dopant is an n-type dopant, wherein an own work function of the metallic pattern is smaller than an own work function of the bulk portion.

* * * * *